(12) United States Patent
Bogner et al.

(10) Patent No.: US 7,601,550 B2
(45) Date of Patent: Oct. 13, 2009

(54) METHODS FOR PRODUCING A LIGHT EMITTING SEMICONDUCTOR BODY WITH A LUMINESCENCE CONVERTER ELEMENT

(75) Inventors: Georg Bogner, Lappersdorf (DE); Günter Waitl, Regensburg (DE); Alexandra Debray, Erlangen (DE)

(73) Assignee: Osram GmbH, Munich (DE)

( * ) Notice: Subject to any disclaimer, the term of this patent is extended or adjusted under 35 U.S.C. 154(b) by 153 days.

(21) Appl. No.: 10/204,576

(22) PCT Filed: Mar. 2, 2001

(86) PCT No.: PCT/DE01/00798

§ 371 (c)(1),
(2), (4) Date: Feb. 22, 2005

(87) PCT Pub. No.: WO01/65613

PCT Pub. Date: Sep. 7, 2001

(65) Prior Publication Data

US 2005/0244993 A1    Nov. 3, 2005

(30) Foreign Application Priority Data

Mar. 3, 2000    (DE) .............................. 100 10 638

(51) Int. Cl.
*H01L 21/00* (2006.01)
(52) U.S. Cl. .................. 438/27; 438/29; 257/E33.06
(58) Field of Classification Search ............ 257/E33.06, 257/E33.061; 438/26, 27, 29
See application file for complete search history.

(56) References Cited

U.S. PATENT DOCUMENTS

| 5,674,554 | A | * | 10/1997 | Liu et al. ..................... 427/71 |
|---|---|---|---|---|
| 5,962,971 | A | * | 10/1999 | Chen ......................... 313/512 |
| 6,023,371 | A | * | 2/2000 | Onitsuka et al. ............ 359/620 |
| 6,066,861 | A | * | 5/2000 | Hohn et al. .................... 257/99 |
| 6,146,928 | A | * | 11/2000 | Ishiguro et al. ............. 438/151 |
| 6,193,908 | B1 | * | 2/2001 | Hampden-Smith et al. ..................... 252/301.4 R |
| 6,252,254 | B1 | * | 6/2001 | Soules et al. ................... 257/89 |
| 6,359,381 | B1 | * | 3/2002 | Okuno et al. ................ 313/485 |
| 6,429,583 | B1 | * | 8/2002 | Levinson et al. ............ 313/503 |
| 6,576,930 | B2 | | 6/2003 | Reeh et al. |
| 6,812,500 | B2 | | 11/2004 | Reeh et al. |
| 6,812,732 | B1 | | 11/2004 | Bui |
| 7,078,732 | B1 | | 7/2006 | Reeh et al. |
| 7,126,162 | B2 | | 10/2006 | Reeh et al. |
| 7,151,283 | B2 | | 12/2006 | Reeh et al. |

(Continued)

FOREIGN PATENT DOCUMENTS

DE    3786577    11/1993

(Continued)

*Primary Examiner*—David S Blum
(74) *Attorney, Agent, or Firm*—Fish & Richardson P.C.

(57) ABSTRACT

The invention describes two methods of fabricating semiconductor components in which a luminescence conversion element is applied directly to the semiconductor body (1). In the first method, a suspension (4) containing a bonding agent and at least one luminescent material (5) is applied to the semiconductor body (1) in layers. In the next step the solvent escapes, leaving only the luminescent material (5) with the bonding agent on the semiconductor body.

In the second method, the semiconductor body (1) is provided with a layer (6) of bonding agent to which the luminescent material (5) is applied directly.

25 Claims, 3 Drawing Sheets

U.S. PATENT DOCUMENTS

| | | |
|---|---|---|
| 2001/0030326 A1 | 10/2001 | Reeh et al. |
| 2005/0231953 A1 | 10/2005 | Reeh et al. |

FOREIGN PATENT DOCUMENTS

| | | |
|---|---|---|
| DE | 29804149 | 7/1998 |
| DE | 4128995 | 7/1999 |
| DE | 69602625 | 9/1999 |
| EP | 0884370 | 12/1998 |
| EP | 11031845 | 2/1999 |
| EP | 11046019 | 2/1999 |
| JP | 02-91980 | 3/1990 |
| JP | 11031845 A * | 2/1999 |
| WO | WO 97/50132 | 12/1997 |
| WO | WO 98/05430 | 12/1998 |
| WO | WO 9854930 | 12/1998 |
| WO | WO 99/16136 | 4/1999 |

* cited by examiner a)

b)

c)

d)

METHODS FOR PRODUCING A LIGHT EMITTING SEMICONDUCTOR BODY WITH A LUMINESCENCE CONVERTER ELEMENT

The invention relates to a method for fabricating a light-radiating semiconductor body with a luminescence conversion element as recited in the preambles to claims 1 and 2.

Light-radiating semiconductor components with luminescence conversion elements are known, for example, from WO 97/50132. These arrangements include a semiconductor body that transmits light (primary light) during operation and a luminescence conversion element that converts some of this light to another wavelength range (fluorescent light). The color effect of the light emitted by such a semiconductor component is achieved by additive color mixing of primary and fluorescent light.

The luminescence conversion element can be inserted after the semiconductor body in a number of ways. In many embodiments, the luminescence conversion element is composed of luminescent materials that are embedded in a casting compound surrounding the semiconductor body.

These arrangements have the disadvantage that the luminescent materials are spatially inhomogeneously distributed, due to their having undergone sedimentation inside the casting compound. Furthermore, the sources of primary light—the semiconductor body—and of fluorescent light—the casting compound containing the luminescent material—generally vary in size and shape, causing the color effect to be spatially inhomogeneous and rendering optical images subject to severe chromatic errors. A further disadvantage is that the color effect depends on the optical pathlength in the casting compound, so that production-induced variations in the thickness of the casting compound lead to different color effects. Moreover, if it is necessary for the color effect to be consistent in different viewing directions, the shaping of the components is limited disadvantageously by the fact that the optical wavelength in the casting compound has to be nearly the same for all the desired viewing directions.

The above-cited document specifies further that the luminescent material can also be applied directly to the semiconductor body. This arrangement circumvents the aforesaid disadvantages.

The object underlying the present invention is to develop a method by which luminescent material can be applied directly to a semiconductor body.

This object is achieved by a method as recited in claim 1 or 2. Advantageous improvements of the invention are the subject matter of claims 3 to 12.

According to the invention, in the first method step the semiconductor body is fabricated by a usual method, mounted on a substrate and provided with contacts. In the second step, the luminescent material is suspended, together with a bonding agent, in a solvent containing butyl acetate. This suspension is applied to the semiconductor body in layers. In a third step the component is dried, allowing the solvent to escape and leaving the luminescent material with the bonding agent on the semiconductor body.

A further method according to the invention comprises, in a first method step, fabricating the semiconductor body, mounting it on a substrate and providing it with contacts. In the second step, the semiconductor body is coated with a bonding agent. In the third step, the luminescent material is applied to this layer of bonding agent.

In a preferred embodiment of this method, epoxy resin, acrylic resin or silicone is used as the bonding agent. These materials are often employed in the production of light-emitting diodes and can therefore be used cost-effectively in the methods according to the invention.

In an especially preferred embodiment of the latter method, the luminescent material is scattered over the bonding agent. This method makes it possible to apply a uniform, well-proportioned layer of luminescent material. Alternatively, the luminescent material can be blown or dusted on.

The luminescent material used is preferably an inorganic phosphor such as garnet doped with rare earths, especially Ce; alkaline earth sulfides, thiogallates, aluminates and orthosilicates. Efficient luminescent materials in these cases are compounds that conform to the formula $A_3B_5O_{12}$:M (provided that they are not unstable under ordinary production and operating conditions). In this formula, A denotes at least one element of the group Y, Lu, Sc, La, Gd, Th and Sm; B at least one element of the group Al, Ga and In; and M at least one element of the group Ce and Pr, preferably Ce. The following have proven to be especially efficient luminescent materials: YAG:Ce compounds ($Y_3Al^5O_{12}$:$Ce^{3+}$), TbYAG:Ce compounds (($Tb_xY_{1-x})_3Al_5O_{12}$:$Ce^{3+}$, 0<x<1) and GdYAG:Ce compounds (($Gd_xY_{1-x})_3Al_5O_{12}$:$Ce^{3+}$, 0<x<1) as well as mixed crystals formed therefrom, such as, for example, GdTbYAG:Ce (($Gd_xTb_yY_{1-x-y})_3Al_5O_{12}$;$Ce^{3+}$). Al in these cases can be replaced at least partially by Ga or In. The following compounds are also suitable: SrS:$Ce^{3+}$, Na, SrS:$Ce^{3+}$, Cl, SrS:$CeCl^3$, CaS:$Ce^{3+}$ and SrSe:$Ce^{3+}$.

A luminescent material with an average grain size of 10 μm can be used to particular advantage in both of the methods according to the invention. In prior-art methods, the grain size is much smaller and is kept to a minimum to prevent sedimentation of the luminescent material within the casting compound. Disadvantageously, however, light scattering on the particles of luminescent material increases with diminishing grain size, thereby causing an overall decrease in luminescence conversion efficiency. This disadvantage is avoided with the methods of the invention.

In an advantageous improvement of the methods according to the invention, the production process is extended to include casting of the component in epoxy or acrylic resin.

In a particularly advantageous manner, semiconductor bodies that radiate light with a central wavelength of less than 460 nm can be used in the methods of the invention. The use of such semiconductor bodies with the above-described components of prior art is not expedient, since light in this wavelength range damages the casting compound, especially commercially available epoxy resins, causing it to age very rapidly. This disadvantage does not occur with the methods of the invention, since some of the radiation is converted directly at the semiconductor body, thereby reducing the proportion of short-wave radiation in the casting compound. In addition, the power density of the radiation in the casting compound is lower because the casting is farther away from the radiation-emitting region of the semiconductor body.

Especially advantageously, the methods of the invention are suited for the fabrication of white-light-emitting diodes as described in the above-cited document. In this case, the luminescent material and the semiconductor body are adapted to each other so that the primary-light and fluorescent-light colors are mutually complementary. The effect of white light is elicited by additive color mixing.

A plurality of components produced by a method according to the invention can be combined into larger lighting units. The methods of the invention advantageously permit the manufacture of components that are small in volume and thus have a higher luminance, since no casting compound is needed. Larger lighting units, optionally with a matrix-type arrangement of their components, are distinguished by especially high luminances.

Especially advantageously, components fabricated according to the invention are suitable for use as light sources in imaging lens systems. Since primary and fluorescent light are radiated from volumes that are closely adjacent spatially and are roughly the same size, the chromatic distortions caused by such a lens system are much smaller than those that occur with light sources according to the aforesaid prior art.

Further features and advantages will emerge from the following description of two exemplary embodiments, provided in conjunction with FIGS. 1 to 4.

In the figures:

FIG. 1 illustrates the fabrication of a semiconductor body with a directly applied luminescence conversion element according to the method of claim 1.

Figure 1:
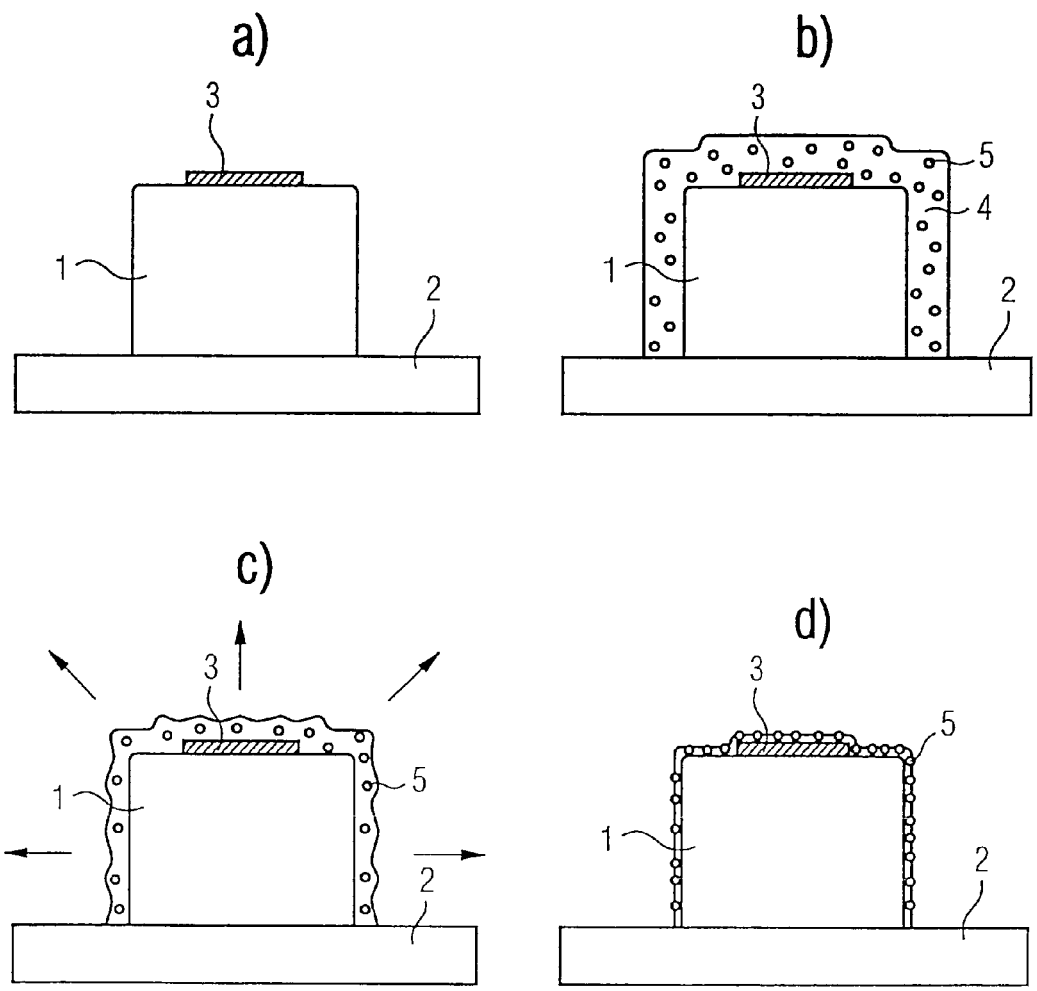
FIG. 1 is a schematic diagram of a first embodiment of a method according to the invention.

In the first method step, FIG. 1a, the semiconductor body 1 is fabricated by a usual production method. The semiconductor body 1 is mounted on a substrate 2 and provided with contacts 3. The subsequent steps do not impose any fundamental limitations on the production process.

In the second method step, FIG. 1b, a thin layer of a suspension 4 of a luminescent material 5 in butyl acetate is applied to at least one surface of the semiconductor body 1. The bonding agent used can be, for example, PERENOL 45 (Henkel). The luminescent material 5 is present in this suspension in a high concentration, with a volume ratio in excess of 40%. The layer of suspension can be produced by being sprayed or dripped on. In the latter case, the quantity of droplets is apportioned to yield a uniformly thin layer that encases the free surfaces of semiconductor body 1. The luminescent material 5 used can be, for example, Ce- or Tb-activated yttrium aluminum garnet or a modification of said garnet. If the suspension layer 4 is applied by a spraying process, it is also possible to cover only subareas of the surface of the semiconductor body with the suspension 4. In addition, rheological additives and wetting agents can be added to the suspension 4 to produce the most uniform possible layer. In the next, third method step, the component is dried, during which process the solvent—butyl acetate in FIG. 1c—evaporates, so that only the luminescent material 5 with the bonding agent remains on the semiconductor body (FIG. 1d).

Figure 2:
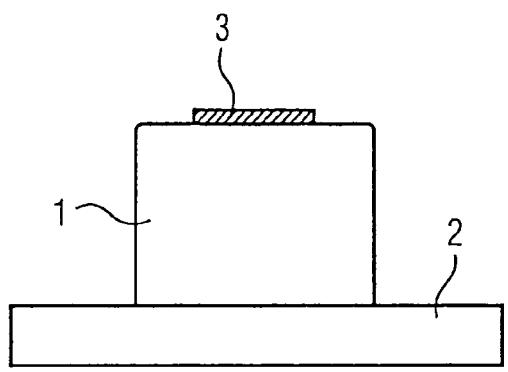
FIG. 2 is a schematic diagram of a second embodiment of a method according to the invention, FIG. 3 schematically depicts the radiation characteristic of a component fabricated according to a method of the invention, and FIG. 4 schematically depicts the radiation characteristic of a component of prior art.
Figure 2:
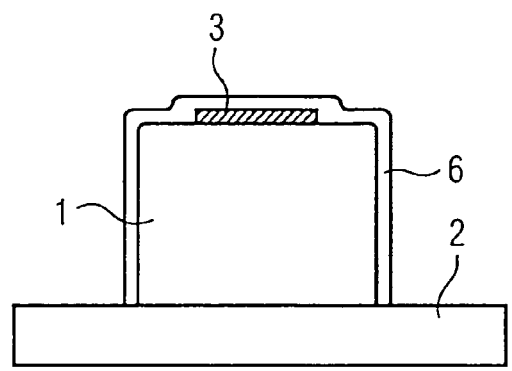
Figure 2:
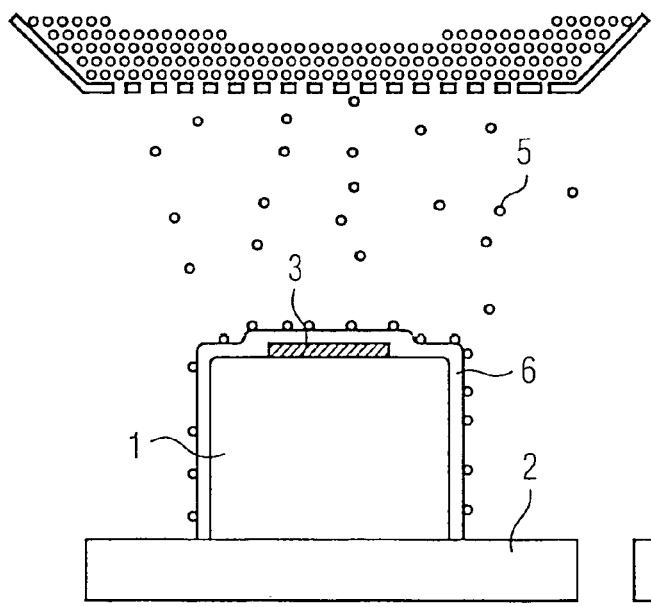
Figure 2:
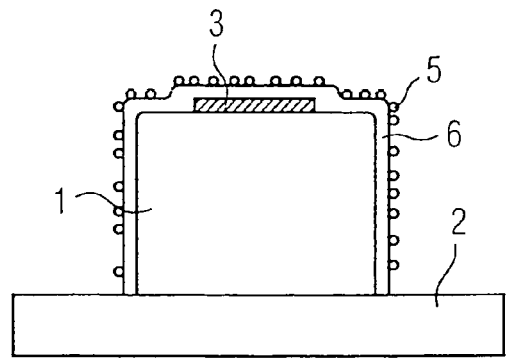

FIG. 2 shows the fabrication of a semiconductor body with a directly applied luminescence conversion element according to the method of claim 3.

In the first method step according to FIG. 2a, here again, the semiconductor body 1 is fabricated, mounted on a substrate 2 and provided with contacts 3.

In the second step, a thin layer of epoxy resin 6 is sprayed onto this semiconductor body as a bonding agent (FIG. 2b). In contrast to the case with components of prior art, this layer 6 does not serve as a casting compound or a casing, but only as an adhesive for the luminescent material 5 that is to be applied.

In the third method step, as shown in FIG. 2c, the luminescent material 5 is scattered on. After this step, the luminescent material 5 adheres in a thin, uniform layer to the surface of semiconductor body 1 (FIG. 2d). Once the epoxy resin has set, further process steps can follow, for example casting of the component or insertion into a lighting matrix.

Figure 3:
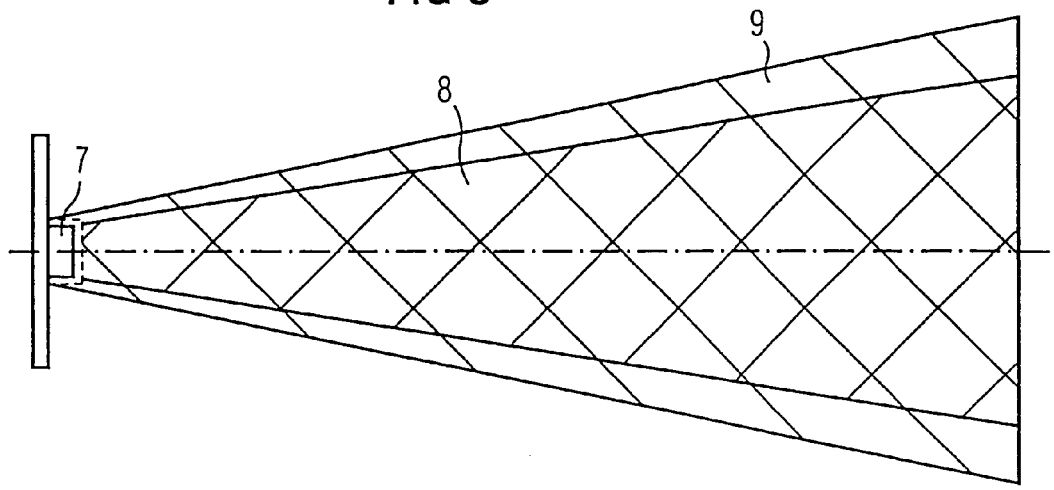

FIG. 3 shows the radiation characteristic of a component 7 fabricated according to a method of the invention. In the case of components 7 according to the invention, the light cones of primary light 8 and of fluorescent light 9 are radiated from nearly identical volumes and therefore largely coincide.

Figure 4:
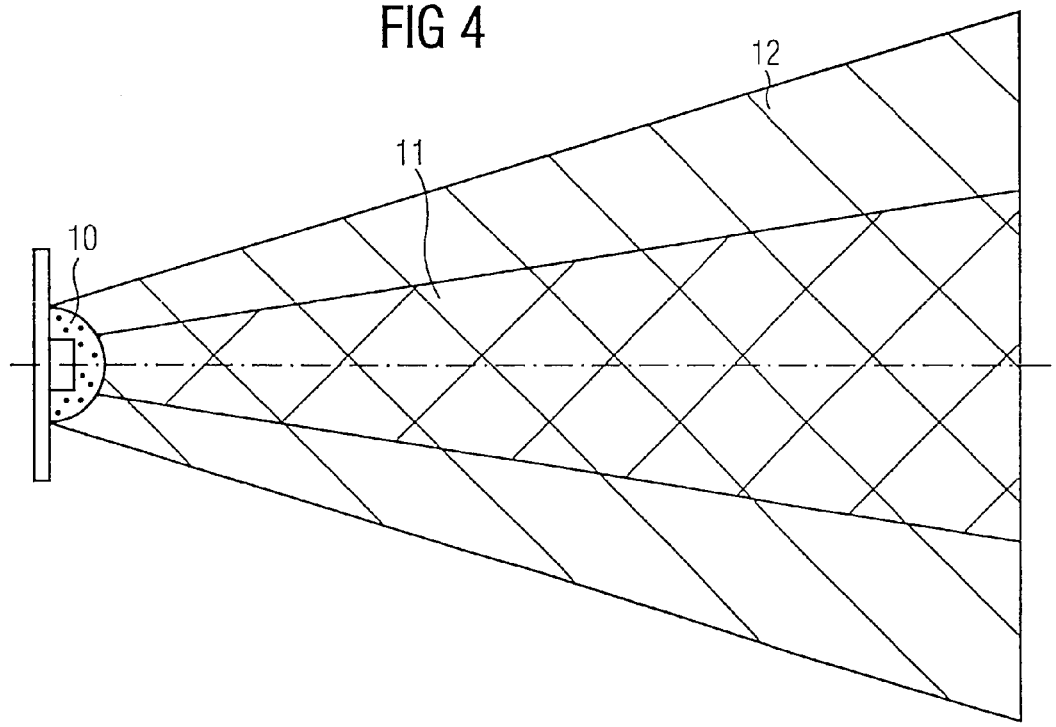

By way of comparison, FIG. 4 shows the radiation characteristic of a component 10 of prior art. Such prior-art components have a primary light cone 11, emitted from the semiconductor body, that is concentrated on the optical axis. The fluorescent light 12 is radiated from the entire casting compound, making the fluorescent light cone 12 much more divergent than the primary light cone 11.

Sighting along the optical axis toward such a component 10 of prior art when it is operating reveals that in the center, the radiated mixed light is altered in the direction of primary color, and in the outer area it is rimmed by a circular border that has the color of the fluorescent light.

By contrast, a component 7 fabricated by a method according to the invention produces a spatially uniform mixed-color effect.

The invention claimed is:

1. A method for fabricating a light-radiating semiconductor component that includes an electrically contacted light emitting semiconductor body, mounted on a substrate element, and a luminescence conversion element that comprises at least one luminescent material and is deposited on said semiconductor body, characterized by the steps of fabricating said semiconductor body, mounting on said substrate element and electrical contacting, applying a layer of bonding agent to at least one surface of said semiconductor body, wherein a maximum thickness of the layer of bonding agent is smaller than a thickness of the semiconductor body, and applying at least one luminescent material to the layer of bonding agent.

2. The method of claim 1, characterized in that epoxy resin, acrylic resin or silicone is used as the bonding agent.

3. The method of claim 1, characterized in that said at least one luminescent material is scattered, blown or dusted on.

4. The method of claim 1, characterized in that said luminescent material contains YAG:Ce, TbYAG:Ce, GdYAG:Ce, GdTbYAG:Ce or mixtures based thereon, Al optionally being replaced at least partially by Ga or In.

5. The method of claim 2, characterized in that said at least one luminescent material is scattered, blown or dusted on.

6. The method of claim 1, characterized in that inorganic phosphors, Ce- or Tb-activated garnets, alkaline earth sulfides or organic dyes are used as said luminescent material.

7. The method of claim 2, characterized in that inorganic phosphors, Ce- or Tb-activated garnets, alkaline earth sulfides or organic dyes are used as said luminescent material.

8. The method of claim 3, characterized in that inorganic phosphors, Ce- or Tb-activated garnets, alkaline earth sulfides or organic dyes are used as said luminescent material.

9. The method of claim 1, characterized in that the average grain size of said at least one luminescent material is 10 μm.

10. The method of claim 1, characterized by casting of the component in epoxy resin or acrylic resin.

11. The method of claim 1, characterized in that the central wavelength of the radiation emitted by said semiconductor body during operation is less than 460 nm.

12. The method of claim 1, characterized in that the color of the radiation emitted by said semiconductor body during operation and the color of the light emitted by said at least one luminescent material are mutually complementary, thereby producing the effect of white light.

13. The use of a plurality of components fabricated according to claim 1, in an LED lighting unit.

14. The use of a plurality of components fabricated according to claim 1, in an LED lighting unit, in which the components fabricated according claim 1 are in a matrix type of arrangement.

15. The use of a component fabricated according to claim 1, as a light source in an imaging optics.

16. A method for fabricating a light-radiating semiconductor component comprising:
   providing a light emitting semiconductor body;
   applying a layer of bonding agent to at least one surface of the semiconductor body, wherein a maximum thickness of the layer of bonding agent is smaller than a thickness of the semiconductor body; and
   applying at least one luminescent material to the layer of bonding agent.

17. The method of claim 16 wherein the application of the at least one luminescent material to the at least one surface of the semiconductor body comprises:
   applying the at least one luminescent material to the semiconductor body such that the volume from which light from the luminescent material radiates matches the volume from which light from the semiconductor body radiates.

18. The method of claim 16 wherein the application of the at least one luminescent material to the at least one surface of the semiconductor body comprises:
   applying the at least one luminescent material to the surface of the semiconductor body such that the at least one luminescent material is not dispersed in the layer of bonding agent.

19. A method for fabricating a light-radiating semiconductor component that includes an electrically contacted semiconductor body mounted on a substrate element, and a luminescence conversion element that comprises at least one luminescent material deposited on said semiconductor body, the method comprising:
   fabricating the semiconductor body, mounting the semiconductor body to a substrate element, and electrically contacting the semiconductor body;
   spraying a layer of bonding agent onto at least one surface of the semiconductor body; and
   applying the at least one luminescent material to the at least one surface of the semiconductor body.

20. A method for fabricating a light-radiating semiconductor component, the method comprising:
   providing a light emitting semiconductor body;
   spraying a layer of bonding agent onto at least one surface of the semiconductor body; and
   applying at least one luminescent material to the at least one surface of the semiconductor body.

21. The method of claim 1, wherein the layer of bonding agent is applied to a plurality of surfaces of the semiconductor body, and the at least one luminescent material is applied to the plurality of surfaces.

22. The method of claim 16, wherein the layer of bonding agent is applied to a plurality of surfaces of the semiconductor body, and the at least one luminescent material is applied to the plurality of surfaces.

23. The method of claim 19, wherein the layer of bonding agent is sprayed onto a plurality of surfaces of the semiconductor body, and the at least one luminescent material is applied to the plurality of surfaces.

24. The method of claim 20, wherein the layer of bonding agent is sprayed onto a plurality of surfaces of the semiconductor body, and the at least one luminescent material is applied to the plurality of surfaces.

25. A method for fabricating a light-radiating semiconductor component, the method comprising:
   providing a light emitting semiconductor body;
   applying a layer of bonding agent to a plurality of surfaces of the semiconductor body; and
   applying at least one luminescent material to the layer of bonding agent.

* * * * *

UNITED STATES PATENT AND TRADEMARK OFFICE
CERTIFICATE OF CORRECTION

PATENT NO. : 7,601,550 B2  Page 1 of 1
APPLICATION NO. : 10/204576
DATED : October 13, 2009
INVENTOR(S) : Georg Bogner, Gunther Waitl and Alexandra Debray It is certified that error appears in the above-identified patent and that said Letters Patent is hereby corrected as shown below:

On the Title Page Page 2, Item (56)
Foreign Patent Documents, second Column, please replace
  "EP 11031845 2/1999" with --JP 11031845 2/1999--
  "EP 11046019 2/1999" with --JP 11046019 2/1999--
  Delete "WO WO 98/05430 12/1998"

Signed and Sealed this

Twenty-second Day of December, 2009

David J. Kappos
*Director of the United States Patent and Trademark Office*